(12) United States Patent
Yoshizawa

(10) Patent No.: US 8,952,467 B2
(45) Date of Patent: Feb. 10, 2015

(54) ELECTRONIC DEVICE AND ITS MANUFACTURING METHOD

(71) Applicant: Seiko Epson Corporation, Tokyo (JP)

(72) Inventor: Takahiko Yoshizawa, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/046,423

(22) Filed: Oct. 4, 2013

(65) Prior Publication Data

US 2014/0110799 A1   Apr. 24, 2014

(30) Foreign Application Priority Data

Oct. 19, 2012   (JP) ................................ 2012-231846

(51) Int. Cl.
| | | |
|---|---|---|
| *H01L 31/18* | (2006.01) | |
| *H01L 29/84* | (2006.01) | |
| *B81B 7/00* | (2006.01) | |
| *B81C 1/00* | (2006.01) | |
| *B81B 7/02* | (2006.01) | |

(52) U.S. Cl.
CPC ........... *B81B 7/0058* (2013.01); *B81C 1/00325* (2013.01); *B81B 7/00* (2013.01); *B81B 7/02* (2013.01); *B81C 1/00* (2013.01)
USPC ............................................ 257/415; 438/50

(58) Field of Classification Search
CPC ................. H01L 29/84; H01L 31/18
USPC ............................................ 257/415; 438/50
See application file for complete search history.

(56) References Cited

U.S. PATENT DOCUMENTS

| | | |
|---|---|---|
| 7,157,781 B2 | 1/2007 | Kawasaki et al. |
| 7,838,323 B2 | 11/2010 | Utsumi et al. |
| 7,880,367 B2 | 2/2011 | Nakatani |
| 7,994,594 B2 | 8/2011 | Inaba et al. |
| 8,129,804 B2 | 3/2012 | Inaba et al. |
| 2005/0227401 A1 | 10/2005 | Lee et al. |
| 2007/0287215 A1 | 12/2007 | Utsumi et al. |
| 2010/0207216 A1* | 8/2010 | Drews et al. .................. 257/415 |
| 2011/0039365 A1 | 2/2011 | Utsumi et al. |
| 2011/0104845 A1 | 5/2011 | Nakatani |
| 2012/0127683 A1 | 5/2012 | Inaba et al. |

FOREIGN PATENT DOCUMENTS

| | | |
|---|---|---|
| JP | A-2003-332587 | 11/2003 |
| JP | A-2005-123561 | 5/2005 |
| JP | A-2005-297180 | 10/2005 |
| JP | A-2008-221435 | 9/2008 |
| JP | A-2009-028806 | 2/2009 |
| JP | A-2009-226582 | 10/2009 |
| JP | A-2010-000556 | 1/2010 |
| JP | A-2010-223850 | 10/2010 |
| JP | A-2011-143486 | 7/2011 |

* cited by examiner

*Primary Examiner* — Marc Armand
(74) *Attorney, Agent, or Firm* — Oliff PLC

(57) ABSTRACT

An electronic device includes a substrate, a sidewall that is disposed on the substrate and forms a cavity, a first layer that is disposed on the sidewall and covers the cavity, a second layer that is formed on the first layer and has a region disposed outside an outline of the first layer in a plan view, a dielectric layer disposed below the region of the second layer disposed outside the outline of the first layer in a plan view, and a functional element disposed inside the cavity.

6 Claims, 8 Drawing Sheets

ELECTRONIC DEVICE AND ITS MANUFACTURING METHOD

The entire disclosure of Japanese Patent Application No. 2012-231846, filed Oct. 19, 2012 is expressly incorporated by reference herein.

BACKGROUND

1. Technical Field

The present invention relates to electronic devices and methods for manufacturing the same.

2. Related Art

Electronic devices that include a functional element such as a micro electromechanical system (MEMS) disposed in a cavity portion formed on a substrate are known. A MEMS, such as, for example, a micro resonator, a micro sensor or a micro actuator functions by vibration, deformation and other operations of a micro structure housed in a cavity portion. Therefore, the micro structure is disposed in the cavity portion in a manner that these operations are not disturbed. For example, JP-A-2005-297180 and JP-A-2005-123561 describe methods of forming such a cavity portion.

According to the method described in JP-A-2005-297180, a micro mechanical element is formed on a surface of one substrate, the substrate is then joined in a vacuum chamber with another substrate with an O ring placed between them, and subsequently, a sealant material is filled outside the O ring. According to the method described in JP-A-2005-123561, a MEMS structure is formed on a substrate, a sacrificial layer is then formed on the MES structure, a first sealant member having through holes is further formed on the sacrificial layer, the sacrificial layer is subsequently removed through the through holes of the first sealant member to release a movable part of the MEMS structure, and finally, the through holes of the first sealant member are covered and closed by a second sealant member such as a chemical vapor deposition (CVD) film.

There is a demand for further miniaturization of electronic devices, and the demand consequently requires further reduction of the area occupied by a cavity over a substrate where a functional element is disposed. However, as the device is reduced in size, the cavity and the member with which the cavity is formed are consequently miniaturized, such that the mechanical strength for retaining the cavity may become insufficient. If the strength of the member that forms the cavity is insufficient, for example, the cavity could not be maintained due to mechanical and thermal stress or vibration at the time of mounting, and thus it is feared that the reliability of the electronic device would be lowered.

SUMMARY

An advantage of some aspects of the invention is to provide a highly reliable electronic device with a functional element that is small in size and disposed in a solid and strong cavity, as well as a method of manufacturing the same.

Another advantage of the aspects of the invention is to provide a technology capable of solving at least a part of the aforementioned problems, and the invention can be implemented as the following embodiments or application examples.

APPLICATION EXAMPLE 1

Application Example 1 pertains to an electronic device including a substrate, a sidewall that is disposed on the substrate and forms a cavity, a first layer that is disposed on the sidewall and covers the cavity, a second layer that is formed on the first layer and has a region disposed outside an outline of the first layer in a plan view, a dielectric layer disposed below the region of the second layer disposed outside the outline of the first layer in a plan view, and a functional element disposed inside the cavity.

According to the electronic device of the present application example, the second layer has the region disposed outside the outline of the first layer, and the dielectric layer is disposed below the region of the second layer disposed outside the outline of the first layer in a plan view of the second layer, such that the mechanical strength of the member that forms the cavity can be enhanced. According to the electronic device of the present application example, in particular, the mechanical strength can be increased against an external force that acts to crush the cavity. Therefore, the electronic device of the present application example can secure high reliability as the functional element is disposed within the small and strong cavity.

APPLICATION EXAMPLE 2

In Application Example 1, the region disposed outside the outline of the first layer in a plan view of the second layer may encircle the cavity.

According to the electronic device of Application Example 2, as the region disposed outside the outline of the first layer in a plan view of the second layer encircles the cavity, the cavity can be more reliably formed. Further, the cavity can be formed stronger.

APPLICATION EXAMPLE 3

In Application Example 1 or Application Example 2, the dielectric layer may be present between a region disposed outside an outline of the cavity in a plan view of the first layer and the second layer.

According to the electronic device of Application Example 3, the first layer and the second layer are configured to sandwich the dielectric layer, such that the mechanical strength for retaining the cavity can be further improved. Also, according to the electronic device of Application Example 3, the mechanical strength against an external force that acts to crush the cavity is not only enhanced, but the mechanical strength against an external force that acts to open up the cavity can be enhanced.

APPLICATION EXAMPLE 4

In any one of Application Examples 1 through 3, the first layer and the second layer may have common through holes penetrating to the cavity.

According to the electronic device of Application Example 4, the portion inside the cavity can be etched in the state in which the first layer and the second layer are formed, such that the solidity of the cavity at the time of etching can be secured. For this reason, for example, manufacturing yield can be improved, and therefore excellent productivity is achieved.

APPLICATION EXAMPLE 5

In Application Example 4, the electronic device may further include a third layer formed on the second layer, and the third layer may seal the through holes.

According to the electronic device of Application Example 5, the mechanical strength for retaining the cavity can be further improved.

APPLICATION EXAMPLE 6

In Application Example 5, the third layer may include a layer formed from one kind or an alloy of two or more kinds selected from the group consisting of Al, W and Cu.

According to the electronic device of Application Example 6, the mechanical strength for retaining the cavity can be even further improved.

APPLICATION EXAMPLE 7

In any one of Application Example 1 through Application Example 6, the second layer may include a layer composed of one kind or an alloy or a composite nitride of two or more kinds selected from the group consisting of TiN, TaN, Ti, Ta, W, Au, Pt, Co and Ni.

According to the electronic device of Application Example 7, the mechanical strength of the second layer is high, and adhesion between the second layer and the first layer can be increased, such that the mechanical strength for retaining the cavity can be even further improved.

APPLICATION EXAMPLE 8

In any one of Application Example 1 through Application Example 7, the first layer may include a laminated structure having three layers or more, an uppermost layer of the laminated structure may be a layer composed of one kind or an alloy of two or more kinds selected from the group consisting of TiN, Ti, W, Au and Pt, a lowermost layer of the laminated structure may be a layer composed of one kind or an alloy of two or more kinds selected from the group consisting of TiN, Ti, W, Au and Pt, and at least one of the layers in the laminated structure may be composed of Al—Cu alloy.

According to the electronic device of Application Example 8, the mechanical strength of the first layer is high, and adhesion between the second layer and the first layer can be increased, such that the mechanical strength for retaining the cavity can be even further improved.

APPLICATION EXAMPLE 9

A method for manufacturing an electronic device in accordance with an embodiment of the invention includes forming a functional element in a first region of a substrate, forming a transistor in a second region of the substrate, forming an interlayer dielectric layer that covers the transistor and the functional element, forming a sidewall surrounding the functional element in the interlayer dielectric layer, forming a first layer that covers the interlayer dielectric layer and connects to the side wall, forming a dielectric layer that covers the first layer, removing a region of the dielectric layer inside the side wall as viewed in a plan view, forming a second layer composed of one kind or an alloy or a composite nitride of two or more kinds selected from the group consisting of TiN, TaN, Ti, Ta, W, Au, Pt, Co and Ni on the first layer and on the dielectric layer, forming through holes in the first layer and the second layer in the first region, and forming a cavity that contains the functional element by etching and removing the interlayer dielectric layer surrounded by the side wall through the through holes. In one aspect, the second layer is formed with a region that is disposed outside an outline of the first layer in a plan view, and the dielectric layer is disposed below the region disposed outside the outline of the first layer in the plan view of the second layer.

According to the method for manufacturing an electronic device of Application Example 9, the second layer has a region disposed outside the outline of the first layer, and the dielectric layer is disposed below the region disposed outside the outline of the first layer as viewed in a plan view of the second layer, such that an electronic device can be manufactured with a member for forming a cavity which has high mechanical strength. Also, according to the method for manufacturing an electronic device of the present application example, in the step of forming a cavity that contains the functional element by etching and removing the interlayer dielectric layer surrounded by the sidewall (i.e., release etching step), the second region is protected by the second layer, such that the etching process can be performed for a long time. Furthermore, the release etching process can be performed without using a resist mask, such that organic solution can be used in the cleaning step, and therefore, for example, sticking can be controlled. Moreover, as a resist mask is not used, the step of removing a resist mask is not necessary, such that problems such as contamination and the like can be reduced.

APPLICATION EXAMPLE 10

Application Example 9 may further include forming a third layer that seals the through holes on the second layer, removing the second layer and the third layer in the second region by patterning the second layer and the third layer, and etching the dielectric layer in the second region.

According to the method for manufacturing an electronic device of Application Example 10, an electronic device whose mechanical strength for retaining a cavity is further improved can be manufactured.

DESCRIPTION OF EXEMPLARY EMBODIMENTS

Some of exemplary embodiments of the invention are described below. Note that the embodiments described herein are examples of the invention, and the invention is not at all limited by the embodiments, and includes various modifications within the range that does not depart from the subject matter of the invention. Note also that not all constituting elements to be described below would necessarily be indispensable to the invention.

1. Electronic Device

Figure 1:
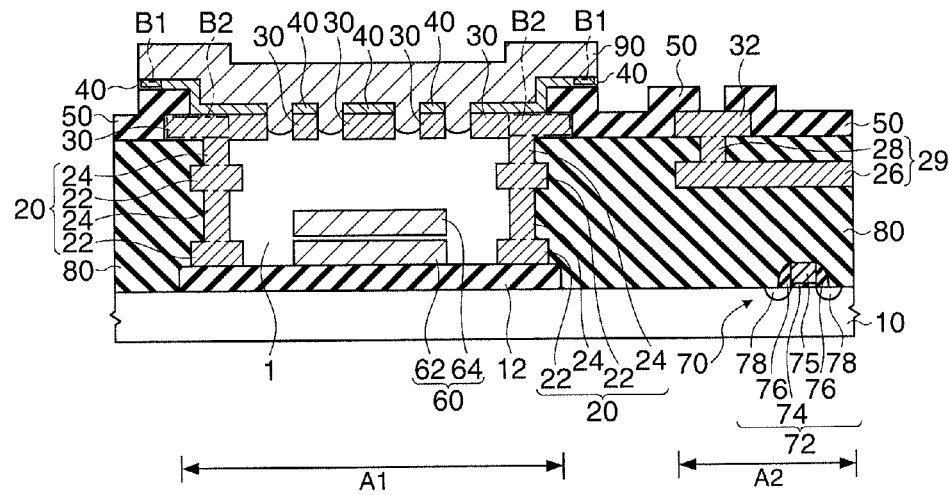
FIG. 1 schematically shows a cross-sectional view of an electronic device in accordance with an embodiment of the invention.
Figure 2:
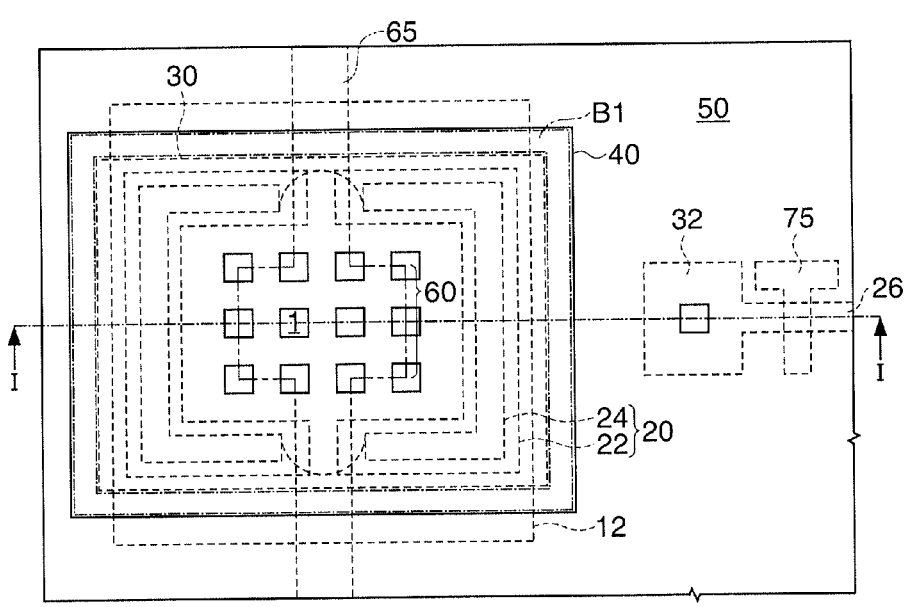
FIG. 2 schematically shows a plan view of the electronic device in accordance with the embodiment of the invention.

An electronic device in accordance with an embodiment of the invention will be described with reference to the accompanying drawings. FIG. 1 is a view schematically showing a cross section of an electronic device 100 in accordance with an embodiment of the invention. FIG. 2 is a plan view schematically showing the electronic device 100 in accordance with the present embodiment. FIG. 1 corresponds to a cross section taken along a line I-I of FIG. 2. Further, illustration of a third layer is omitted in FIG. 2.

The electronic device 100 includes a substrate 10, a sidewall 20 forming a cavity 1, a first layer 30 that covers the cavity 1, a second layer 40, a dielectric layer 50, and a functional element 60 disposed within the cavity 1, as shown in FIG. 1 and FIG. 2.

The substrate 10 includes a first region A1 where the cavity 1 that contains the functional element 60, and a second region A2 where a circuit section 70 is formed. As the substrate 10, for example, a semiconductor substrate such as a silicon (Si) substrate or the like can be used. As the substrate 10, various other substrates, such as, a ceramics substrate, a glass substrate, a sapphire substrate, a synthetic resin substrate and the like may also be used. The substrate 10 is, for example 100 μm-400 μm in thickness.

The substrate 10 may have a base layer 12 shown in the figure. The base layer 12 is formed on the substrate 10. The base layer 12 is formed at least in the first region A1 where the cavity 1 is formed. As the material of the base layer 12, for example, silicon nitride ($Si_3N_4$) may be used. The base layer 12 can function as an etching stopper layer when the cavity 1 is formed. Although not shown, a trench dielectric layer, a LOCOS (Local Oxidation of Silicon) dielectric layer, a semi-recess LOCOS dielectric layer or the like may be formed between the base layer 12 and the substrate 10.

The sidewall 20 is disposed on the substrate 10 and forms the cavity 1. In the example shown in FIG. 1, the sidewall 20 is formed on the base layer 12 around the cavity 1. Also, in the example shown in FIG. 1, the sidewall 20 is formed in a mode in which a wiring section 22 and a wall section 24 are laminated. The sidewall 20 may be considered as a guard ring. In this embodiment, the sidewall 20 includes two each of the wiring section 22 and the wall section 24. However, the number of these elements is not particularly limited, and the number of the wiring sections 22 and the wall sections 24 may be decided according to the number of laminated layers of the interlayer dielectric layer 80, for example. The sidewall 20 is disposed in a manner encircling the functional element 60, as shown in FIG. 2. The planar shape of the sidewall 20 is not particularly limited as long as it surrounds the functional element 60, and may be any one of arbitrary shapes, such as, for example, a circular shape, a polygonal shape or the like. The sidewall 20 may have a gap through which a wiring 65 connected to the functional element 60 is passed, or may be set to have a grounding potential. In the example shown in FIG. 2, the sidewall 20 is formed in a manner to avoid the functional element 60. As the material of the sidewall 20, for example, polycrystalline silicon (poly-silicon), and metal such as aluminum (Al), copper (Cu), tungsten (W) and titanium (Ti), and an alloy of the aforementioned metal may be used.

The first layer 30 is formed in a manner to be disposed on the sidewall 20 and to cover the cavity 1. As shown in FIG. 1, the first layer 30 is formed above the cavity 1. The first layer 30 may have through holes 31. In the example shown in FIG. 1 and FIG. 2, the number of the through holes 31 is twelve, but the number thereof is not limited. The first layer 30 may be formed in one piece with a part or the entirety of the sidewall 20. The first layer 30 may be formed from, for example, one kind or an alloy or a composite nitride of two or more kinds selected from the groups consisting of TiN, TaN, Ti, Ta, W, A, Pt, Co and Ni. Also, the first layer 30 may have a laminated structure in which a Ti layer, TiN layer, an Al—Cu alloy layer and a TiN layer are laminated.

The cavity is a space for containing the functional element 60. The cavity 1 is defined by the base layer 12, the sidewall 20 and the first layer 30 in the example shown in the drawing. The interior of the cavity 1 may be set, for example, in a reduced pressure state, by which the operational accuracy of the functional element can be improved.

The sidewall 20 and the first layer 30 may be provided with a predetermined constant potential (for example, the grounding potential). By this, the sidewall 20 and the first layer 30 can be functioned as an electromagnetic shield. Therefore, the functional element 60 can be shielded from external electric fields and magnetic fields outside the cavity 1, and thus the characteristic of the functional element 60 can be better stabilized.

The functional element 60 is disposed within the cavity 1. The functional element 60 is any arbitrary element without any particular limitation as long as it can be contained in the cavity 1. For example, as the functional element 60, an oscillator, a quartz vibrator, a SAW (surface acoustic wave) element, an acceleration sensor, a gyroscope, a micro actuator, or the like can be exemplified. As a concrete example of the functional element 60, a vibration element having a fixed electrode 62 formed on the base layer 12 as shown in the figure, and a movable electrode 64 formed separated at a predetermined gap from the fixed electrode 62 can be enumerated. As the material of the fixed electrode 62 and the movable electrode 64, for example, polysilicon with electro-conductive property being added by doping predetermined impurities may be enumerated.

The second layer 40 is formed on the first layer 30, and has a region B1 arranged outside the outline of the first layer 30, as seen in a plan view. The plan view of the first layer 30 refers to a view where the first layer 30 is seen from a direction orthogonal to a plate surface of the substrate 10 as shown in FIG. 2. The second layer 40 is formed on the first layer 30 and on a dielectric layer 50. The second layer 40 may have through holes 41. In the example shown in FIG. 1 and FIG. 2, the number of the through holes 41 is twelve (12), but the number thereof is not limited. The second layer 40 may be formed from one kind or an alloy or composite nitride of two or more kinds selected from the group consisting of TiN, TaN, Ti, Ta, W, Au, Pt, Co and Ni.

The dielectric layer 50 is disposed below the region B1 arranged outside the outline of the first layer 30, as seen in a plan view of the second layer 40. For example, the dielectric layer 50 is formed on an interlayer dielectric layer 80 and the first layer 30. As the material of the dielectric layer 50, silicon oxide, silicon nitride, etc. can be used. As the structure of the dielectric layer 50, a single-layer structure of silicon oxide, silicon nitride or the like, or a layered structure of layers of silicon oxide, silicon nitride and the like may be used.

In the electronic device 100 in accordance with the present embodiment, the second layer 40 has the region B1 arranged outside the outline of the first layer 30, and the dielectric layer 50 is disposed under the region B1 arranged outside the outline of the first layer 30, as seen in a plan view of the second layer 40. Therefore, the first layer 30 and the second layer 40 function as a lid for the cavity 1, and the lid is supported not only by the first layer 30, but also in the region B1 of the second layer 40, such that the mechanical strength against deformation of the cavity 1 can be increased. According to the electronic device 100, the mechanical strength by which it resists, in particular, an external force that acts to crush the cavity 1 can be improved. Therefore, according to the electronic device 100 of the present embodiment, the functional element 60 is arranged in the cavity 1 that is small and solid, by which high reliability can be secured.

2. Description of Modifications of Electronic Device

Various modifications can be made in the electronic device 100 in accordance with the present embodiment. Modification examples are described below. Note that members having action and function similar to those of the embodiment described above will be appended with similar reference numbers, and their detailed description shall be omitted.

When the material of the first layer 30 is one kind or an alloy or a composite nitride of two or more kinds selected from the group consisting of TiN, TaN, Ti, Ta, W, Au, Pt, Co and Ni, the mechanical strength of the first layer 30 can be increased, and adhesion thereof with the second layer 40 can be increased, such that the mechanical strength for retaining the cavity 1 can be even further improved. Though the first layer 30 has a single layer structure in the illustrated example, it may be formed from a laminated structure composed of plural layers. When the first layer 30 is provided with a laminated structure, the mechanical strength and the conductive property of the first layer 30 can both be effectively improved. For example, when the first layer 30 has a laminated structure having three layers or more, the uppermost layer of the laminated structure may be made of a layer formed from one kind or an alloy of two or more kinds selected from the group consisting of TiN, Ti, W, Au and Pt, the lowermost layer of the laminated structure may be made of a layer formed from one kind or an alloy of two or more kinds selected from the group consisting of TiN, Ti, W, Au and Pt, and at least one of the layers in the laminated structure may be composed of Al—Cu alloy.

When the material of the second layer 40 is one kind or an alloy or a composite nitride of two or more kinds selected from the group consisting of TiN, TaN, Ti, Ta, W, Au, Pt, Co and Ni, the mechanical strength of the second layer 40 can be increased, and adhesion between the second layer 40 and the first layer 30 can be increased, such that the mechanical strength for retaining the cavity 1 can be further increased. Though the second layer 40 has a single layer structure in the illustrated example, it may be formed from a laminated structure composed of plural layers. For example, the second layer 40 may be formed with a layer composed of one kind or an alloy or a composite nitride of two or more kinds selected from the group consisting of TiN, TaN, Ti, Ta, W, Au, Pt, Co and Ni.

Further, as shown in FIG. 1 and FIG. 2, the through holes 41 in the second layer 40 and the through holes 31 in the first layer 30 are communicated with one another, and may form common through holes penetrating to the cavity 1. With such a structure, the interior of the cavity 1 can be etched in a state in which the first layer 30 and the second layer 40 are formed, such that, for example, the solidity of the cavity 1 at the time of etching can also be secured. Therefore, for example, the manufacturing yield can be improved, and the productivity can be improved.

Furthermore, the region B1 disposed outside the outline of the first layer 30, as seen in a plan view of the second layer 40, can increase the mechanical strength for retaining the cavity 1 because of its presence. However, the region B1 may encircle the cavity 1 in a plan view. With such a structure, the cavity 1 can be formed more reliably, and the cavity 1 can be formed much stronger.

Moreover, a dielectric layer 50 may be present between the region B2 disposed outside the outline of the cavity 1 as seen in a plan view of the first layer 30 and the second layer 40. In the example shown in FIG. 1 and FIG. 2, the dielectric layer 50 is present between the region B2 disposed outside the outline of the cavity 1 as seen in a plan view of the first layer 30 and the second layer 40. Therefore, according to the electronic device 100, the dielectric layer 50 is sandwiched between the first layer 30 and the second layer 40. With such a structure, the mechanical strength for retaining the lid formed from the first layer 30 that forms the cavity 1 and the second layer 40 can be further improved. In other words, the lid is supported not only by the first layer 30 but also at the region B1 of the second layer 40, and the first layer 30 is mechanically pressed down by the dielectric layer 50. Therefore, the mechanical strength against deformation of the cavity 1 can be further increased. Therefore, according to the electronic device 100, not only does the mechanical strength against an external force that acts to crush the cavity increase, but the mechanical strength against an external force that acts to open up the cavity can also be increased. Accordingly, the electronic device 100 exemplified can secure very high reliability as the functional element 60 is disposed within the small and strong cavity 1.

3. Other Compositions

The electronic device 100 may include a circuit section 70, an interlayer dielectric layer 80, wiring 26, a via 28, a pad 32, and a third layer 90.

As shown in FIG. 1, the circuit section 70 for driving the functional element 60 may be formed on the substrate 10. The circuit section 70 can be composed of a transistor 72, a capacitor (not shown in the figure), etc. For example, the circuit section 70 includes the transistor 72. The transistor 72 is formed on the substrate 10. The transistor 72 is a MOS transistor that has a gate dielectric film 74, a gate electrode 75, a source or a drain region 78, and a side wall 76. Moreover, the wiring 26 and the via 28 is formed in a second region A2 of the substrate 10 in the example shown in the figure. The wiring 26 and the via 28 may electrically connect the transistor 72 with other elements (not shown in the figure) that compose the circuit section 70.

The gate dielectric film 74 of the transistor 72 is formed on the substrate 10. The gate dielectric film 74 is formed from, for example, a silicon oxide layer. The gate dielectric film 74 is sandwiched between the substrate 10 and the gate electrode 75. The material of the gate electrode 75 is, for example, polysilicon in which conductivity is added by doping predetermined impurities. The source or drain region 78 is formed in the substrate 10. The source or drain region 78 is formed in the substrate 10 by doping predetermined impurities. The sidewall 76 is formed to the side of the gate electrode 75. The material of the sidewall 76 is, for example, silicon nitride ($Si_3N_4$) or silicon oxynitride (SiON).

In the example shown in the figure, the interlayer dielectric layer 80 is formed above the substrate 10. The interlayer dielectric layer 80 may be a laminate of two or more layers, though the interlayer dielectric layer 80 in the electronic device 100 is continuously drawn in the example shown in FIG. 1. For example, silicon oxide ($SiO_2$) may be used as the material of the interlayer dielectric layer 80. Note that the cavity 1 corresponds to an area where the interlayer dielectric layer 80 is removed.

The pad 32 is formed on the via 28. The material of the pad 32 may be, for example, the same as that of the first layer 30. In the example shown in the figure, the pad 32 contains the wiring 26 and the via 28, thereby forming a wiring. The material of the wiring 26 and the via 28 may be, for example, the same as that of the wiring section 22 at the sidewall 20 and the wall section 24.

The electronic device 100 may include a third layer 90. The third layer 90 is formed on the second layer 40. The third layer 90 can close the through holes 31 in the first layer 30 and the through holes 41 in the second layer 40. For example, Al, Cu, Ti and W may be enumerated as the material of the third layer 90. When the material of the third layer 90 is one kind or an alloy of two or more kinds selected from the group consisting of Al, W and Cu, the mechanical strength by which the cavity 1 is maintained can be further improved. Though the third layer 90 has a single layer structure in the illustrated example, it may be formed from a laminated structure composed of plural layers. For example, the third layer 90 may be formed from a layer composed of one kind or an alloy of two or more kinds selected from the group consisting of Al, W and Cu.

The film thickness of the third layer 90 is, for example, 1 μm to 5 μm. The first layer 30, the second layer 40 and the third layer 90 cover the cavity 1 from above, thereby functioning as a sealing member that seals the cavity 1. As the electronic device 100 has the third layer 90, the mechanical strength for retaining the cavity 1 can be improved further.

The electronic device 100 may further include a resin layer, a pad, an external terminal, a wiring layer, a resist layer, and the like though not shown in the figure. Moreover, the electronic device 100 may have a WCSP structure.

4. Method for Manufacturing Electronic Device

Next, a method for manufacturing the electronic device 100 will be described with reference to the accompanying drawings. FIGS. 3-16 are cross-sectional views schematically showing the electronic device 100 in a manufacturing process in accordance with an embodiment of the invention.

The method for manufacturing an electronic device in accordance with the present embodiment includes forming a functional element 60 in a first region A1 of a substrate 10, forming a transistor 72 in a second region A2 of the substrate 10, forming an interlayer dielectric layer 80 that covers the transistor 72 and the functional element 60, forming a sidewall 20 surrounding the functional element 60 in the interlayer dielectric layer 80, forming a first layer 30 that covers the interlayer dielectric layer 80 and connects to the side wall 20, forming a dielectric layer 50 that covers the first layer 30, removing a region of the dielectric layer 50 inside the side wall 20, forming a second layer 40 composed of one kind or an alloy or a nitride composite of two or more kinds selected from the group consisting of TiN, TaN, Ti, Ta, W, Au, Pt, Co and Ni on the first layer 30 and on the dielectric layer 50, forming through holes 31 and 41 in the first layer 30 and the second layer 40 in the first region A1, and forming a cavity 1 that contains the functional element 60 by etching and removing the interlayer dielectric layer 80 surrounded by the side wall 20 through the through holes 31 and 41. The second layer 40 is formed with a region B1 that is disposed outside an outline of the first layer 30 in a plan view, and the dielectric layer 50 is disposed below the region B1 disposed outside the outline of the first layer 30 in the plan view of the second layer 40.

Figure 3:
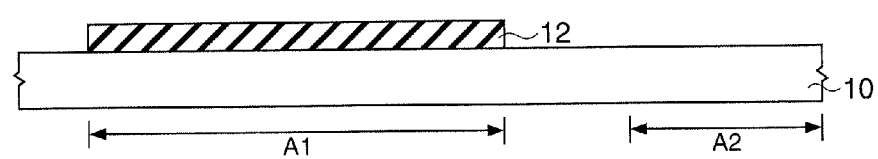
FIG. 3 schematically shows a cross section of an electronic device in a step of a manufacturing method in accordance with an embodiment of the invention.

In the present embodiment, as shown in FIG. 3, the base layer 12 is formed on the substrate 10. The base layer 12 is formed through, for example, forming a film by a CVD (Chemical Vapor Deposition) method, a sputtering method or the like, and patterning the film by photolithography technique and etching technique.

Figure 4:
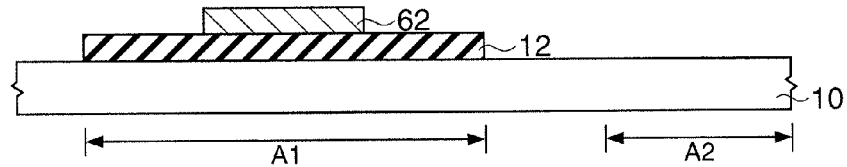
FIG. 4 schematically shows a cross section of the electronic device in a step of the manufacturing method in accordance with the embodiment.

Next, as shown in FIG. 4, a fixed electrode 62 is formed on the base layer 12. More specifically, for example, a semiconductor layer of polysilicon or the like (not shown) is formed by a CVD method or a sputter method, and the film is patterned by photolithography technique and etching technique. Then, impurities such as phosphorous (P), boron (B) or the like are implanted in the patterned semiconductor layer, thereby forming the fixed electrode 62.

Figure 5:
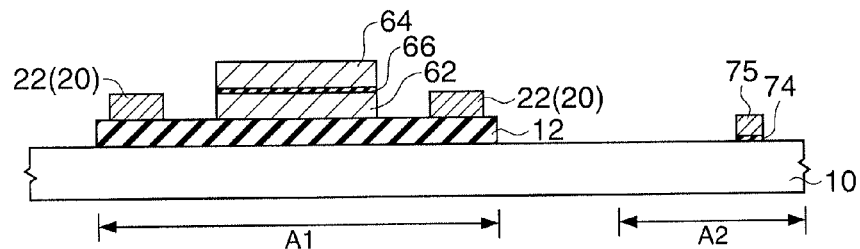
FIG. 5 schematically shows a cross section of the electronic device in a step of the manufacturing method in accordance with the embodiment.

Then, as shown in FIG. 5, a covering layer (a sacrificial layer) 66 that covers the fixed electrode 62 and a gate dielectric film 74 are formed. The covering layer 66 and the gate dielectric film 74 are, for example, silicon oxide layers. The covering layer 66 may be formed, for example, by thermal oxidation of the fixed electrode 62. The gate dielectric film 74 is formed as the substrate 10 is thermally oxidized. The thermal oxidation treatment to the fixed electrode 62 and the gate dielectric film 74 is conducted at temperatures, for example, between 800° C. and 1100° C. In this process, the covering layer 66 and the gate dielectric film 74 can be formed in the same step. The relation between the film thickness of the covering layer 66 and the film thickness of the gate dielectric film 74 can be controlled by adjusting the relation in crystallinity and impurity concentration between the fixed electrode 62 and the substrate 10. The covering layer 66 and the gate dielectric film 74 may be formed by using a CVD method or a sputter method. Then, a movable electrode 64 is formed on the covering layer 66, and a gate electrode 75 is formed on the gate dielectric film 74. The movable electrode 64 and the gate electrode 75 may be formed by, for example, a CVD method, a sputter method, or the like, and patterning using photolithography technique, etching technique and the like. The movable electrode 64 and the gate electrode 75 may be formed at the same time or independently from one another. Moreover, a wiring section 22 in the sidewall 20 may be formed at the same time when forming the movable electrode 64 and the gate electrode 75. In this example, the wiring section 22 in the sidewall 20 is formed at the same time when forming the movable electrode 64 and the gate electrode 75.

Next, an impurity is injected into the movable electrode 64 and the gate electrode 75. As a result, the movable electrode 64 and the gate electrode 75 are provided with electroconductive property. For example, phosphorus (P) and boron (B) may be enumerated as the impurity to be injected. Also, heat-treatment may be conducted for activation of the impurities. Note that the process of injecting the impurity into the movable electrode 64 and the gate electrode 75 may be conducted prior to the process of patterning.

Next, a part of source or drain region 78 is formed by injecting a predetermined impurity into the second area A2 of the substrate 10. Next, a side wall 76 is formed by a CVD method, a dry etching method, and the like. Next, the source or drain region 78 is formed by injecting a predetermined impurity, using the side wall 76 as a mask. The transistor 72 is formed with these processes in the second area A2 of the substrate 10. In this example, a LDD (Lightly doped drain) structure is formed, but the transistor 72 may be formed in a different structure.

Figure 6:
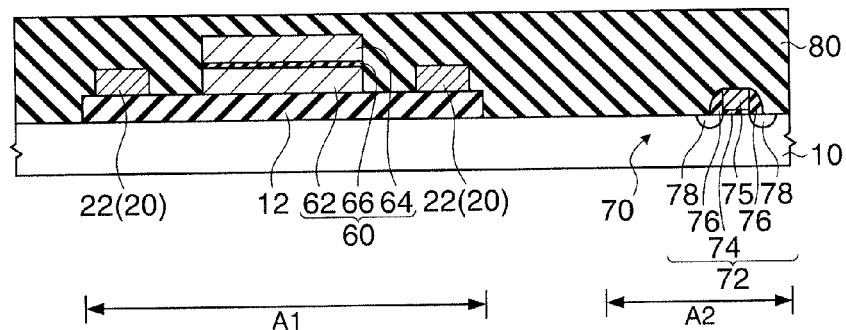
FIG. 6 schematically shows a cross section of the electronic device in a step of the manufacturing method in accordance with the embodiment.
Figure 7:
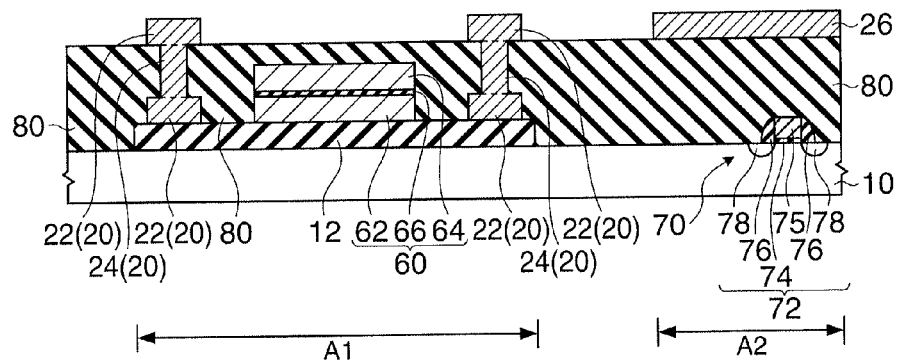
FIG. 7 schematically shows a cross section of the electronic device in a step of the manufacturing method in accordance with the embodiment.

Next, the interlayer dielectric layer 80 is formed, as shown in FIG. 6. The interlayer dielectric layer 80 is formed by, for example, a CVD method and a coating (spin coating) method or the like. After forming the interlayer dielectric layer 80, a planarization process may be applied to the surface of the interlayer dielectric layer 80.

Figure 8:
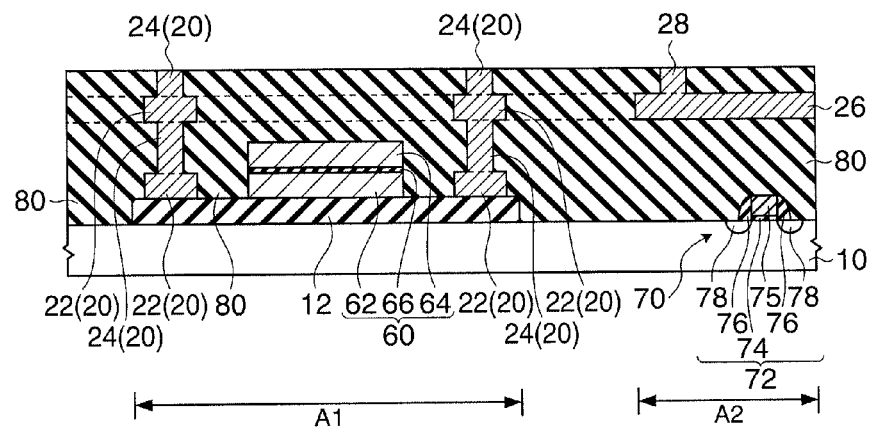
FIG. 8 schematically shows a cross section of the electronic device in a step of the manufacturing method in accordance with the embodiment.

The wall section 24 is formed on the wiring section 22 in the sidewall 20. The wall section 24 may be formed through, for example, forming a groove penetrating the interlayer dielectric layer 80 by patterning the interlayer dielectric layer 80, and embedding a metal such as Al, W or the like in the groove. Next, another part of the interlayer dielectric layer 80, the wiring 26 for the circuit section 70 and the wiring section 22 in the sidewall 20 are formed. In this example, the wiring section 22 is formed, but it is not an indispensable step. For example, a part of the wall section 24 to be formed in the next step may be formed continuous with a part of the wall section 24 and the wiring section 22 that have been formed in the preceding step. This part of the interlayer dielectric layer 80 may be formed in a similar manner as described above. In FIG. 8, the interlayer dielectric layer 80 and the sidewall 20 are illustrated as being in one piece. Then, as shown in FIG. 8, in a manner similar to the above, the wall section 24 and the via 28 for the circuit section 70 are formed on the wiring section 22 in the sidewall 20. After forming the interlayer dielectric layer 80, planarization treatment may be applied to the surface of the interlayer dielectric layer 80.

Figure 9:
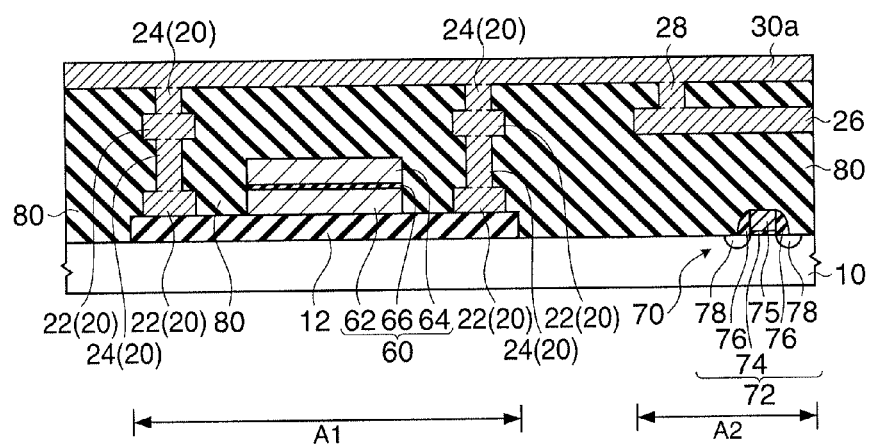
FIG. 9 schematically shows a cross section of the electronic device in a step of the manufacturing method in accordance with the embodiment.
Figure 10:
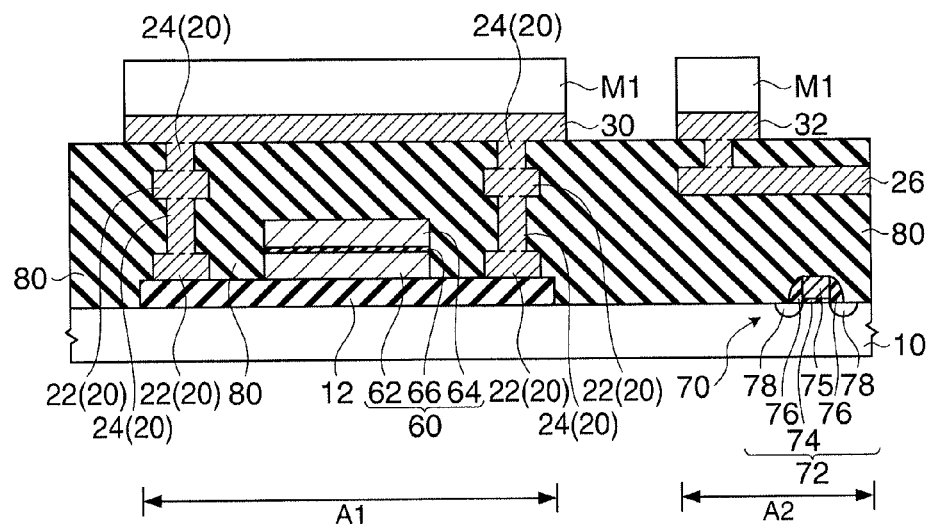
FIG. 10 schematically shows a cross section of the electronic device in a step of the manufacturing method in accordance with the embodiment.

Next, the first layer 30 and the pad 32 for the circuit section 70 are formed. The first layer 30 and the pad 32 are formed in a similar manner as being conducted to form the wiring 26. Note that the first layer 30 and the pad 32 may be formed in the same step, or may be formed in different steps. Also, the first layer 30 and the wall section 24 of the sidewall 20 may be integrally formed in one piece. If the wiring 26, the via 28 and the pad 32 are formed in the same steps as the steps of forming the wiring section 22 of the sidewall 20, the wall section 24 and the first layer 30, the manufacturing process can be simplified because the manufacturing steps can be commonly used. FIG. 9 and FIG. 10 show an example of forming the pad 32 and the first layer 30 in the same steps. This example shows the state in which, as shown in FIG. 9, a first layer 30a is formed by a CVD method or a sputter method, and then, as shown in FIG. 10, the first layer 30a is patterned using a mask M1 as a mask, thereby forming the pad 32 and the first layer 30.

Figure 11:
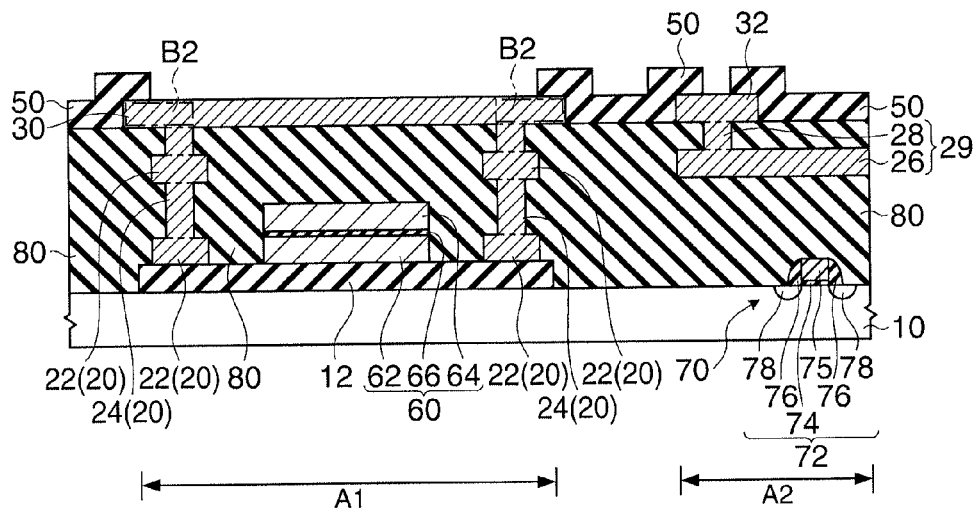
FIG. 11 schematically shows a cross section of the electronic device in a step of the manufacturing method in accordance with the embodiment.

Next, as shown in FIG. 11, a dielectric layer 50 is formed on the interlayer dielectric layer 80 and the pad 32, while avoiding a region corresponding to the cavity 1, as viewed in a plan view of the first layer 30. In this case, it is not indispensable to form the dielectric layer 50 on the first layer 30. However, by forming it on the first layer 30, the dielectric layer 50 can be disposed between a region B2 extending outside the outline of the cavity 1, as seen in a plan view of the first layer 30, and the second layer 40, such that an electronic device 100 with improved mechanical strength for retaining the lid made of the first layer 30 that forms the cavity 1 and the second layer 40 can be manufactured. The dielectric layer 50 may be formed through, for example, forming a film by a sputter method or a CVD method, and then patterning the film by photolithography technique and etching technique. If necessary, heat treatment, such as, sintering may be conducted. In the present embodiment, as shown in FIG. 11, the dielectric layer 50 is formed on the first layer 30, and the dielectric layer 50 is disposed between the region B2 arranged outside the outline of the cavity 1, as viewed in a plan view of the first layer 30, and the second layer 40 to be formed later.

Figure 12:
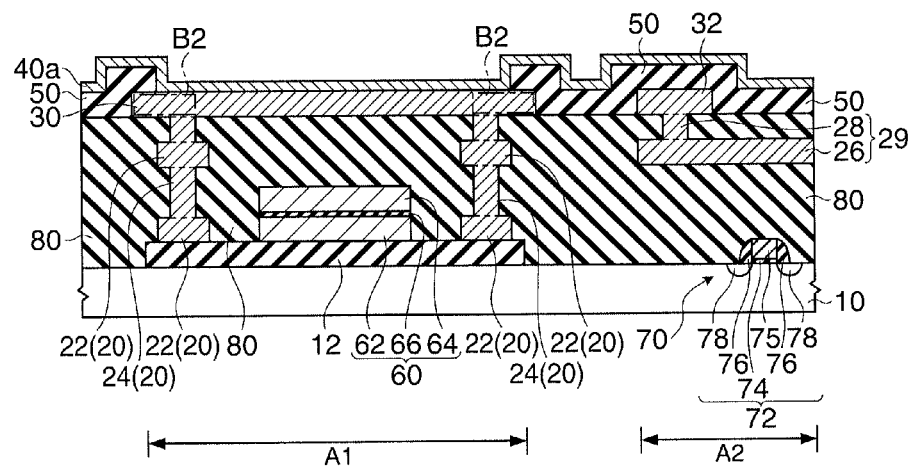
FIG. 12 schematically shows a cross section of the electronic device in a step of the manufacturing method in accordance with the embodiment.
Figure 13:
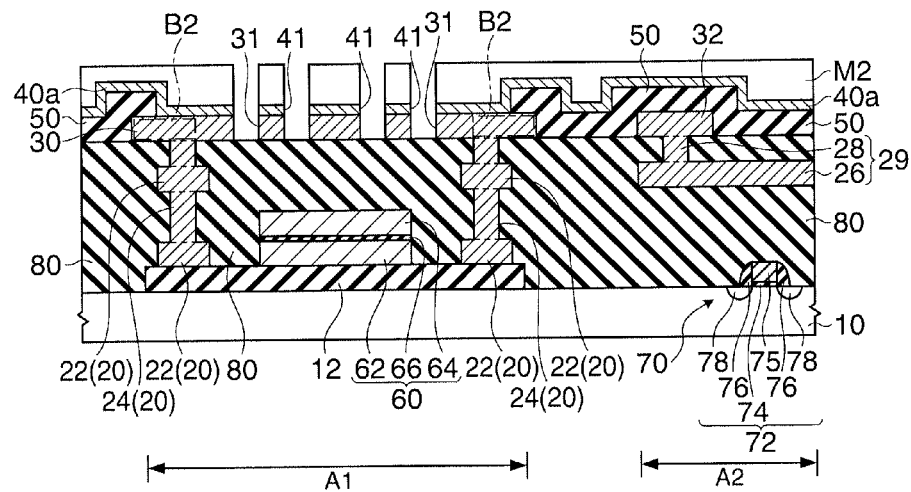
FIG. 13 schematically shows a cross section of the electronic device in a step of the manufacturing method in accordance with the embodiment.
Figure 14:
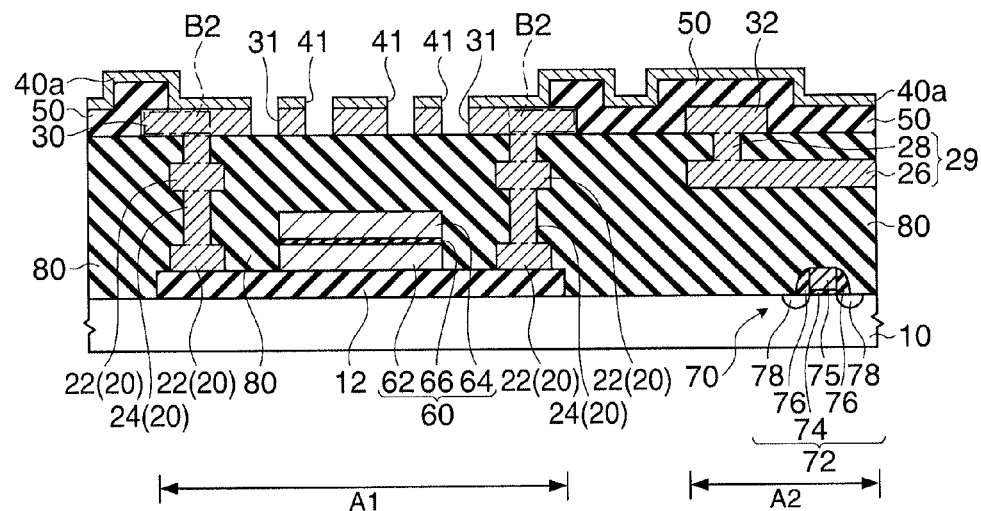
FIG. 14 schematically shows a cross section of the electronic device in a step of the manufacturing method in accordance with the embodiment.

Next, as shown in FIG. 12, a second layer 40a composed of one kind or an alloy or a composite nitride of two or more kinds selected from the group consisting of TiN, TaN, Ti, Ta, W, Au, Pt, Co and Ni is formed over the entire top surface. The second layer 40a may be formed by a CVD method, a sputter method or the like. Then, as shown in FIG. 13, patterning is conducted by using photolithography technique and etching technique, using a mask M2, thereby forming through holes 41 and 31 that communicate with the cavity, as shown in FIG. 14. By selecting a condition such that the first layer 30 and the second layer 40a can be etched with the same etchant, the through holes 31 and 41 can be formed in a manner that the through holes 31 can also be formed in the first layer 30 in the same step. It is noted, however, that the through holes 31 may be formed in a different step.

Figure 15:
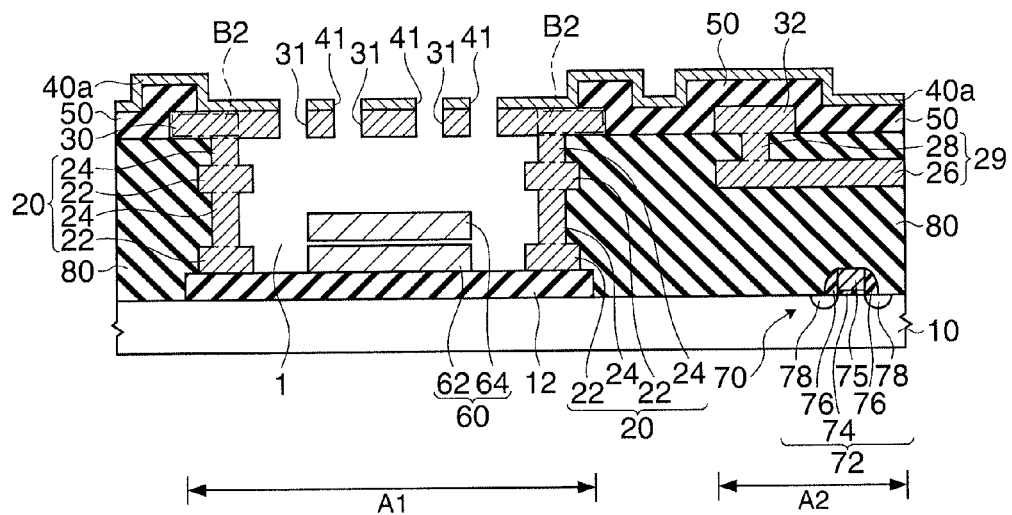
FIG. 15 schematically shows a cross section of the electronic device in a step of the manufacturing method in accordance with the embodiment.

Next, as shown in FIG. 15, etching solution or etching gas is passed through the through holes 31 and 41, thereby removing the interlayer dielectric layer 80 and the covering layer 66 that are present in a region that becomes to be the cavity 1, whereby the cavity 1 is formed. This process may be referred in the present specification as a release process. For example, the release process can be conducted by wet etching that uses hydrofluoric acid or buffered fluoric acid (mixed solution of hydrofluoric acid and ammonium fluoride), or by dry etching that uses hydrogen fluoride group gas or the like. By forming the sidewall 20 and the first layer 30 with material that is not etched in the release process, the cavity 1 can be prevented from extending outside of the sidewall 20. Moreover, the base layer 12 can function as an etching stopper layer. The functional element 60 is formed in the first region A1 of the substrate 10 through the steps describe above.

Moreover, the circuit section 70 is masked by the second layer 40a in the release process. Therefore, for example, etching of the dielectric layer 50 is suppressed in the release process, and therefore the time to be spent for the release process can be lengthened. Moreover, as the release process is conducted with the second layer 40a being used as a mask, it is advantageous in the point that the mask needs not be removed, and an organic solvent may be readily used in the following cleaning process, compared with the case where a mask composed of photoresist of an organic group material or the like is used.

Next, the cavity 1 is cleaned. For example, the cleaning can be conducted with isopropyl alcohol (IPA) or water. By conducting the cleaning process, using a solvent with small surface tension such as IPA or the like, sticking in which members mutually adhere can be controlled, when a minute structure exists in the functional element 60.

Figure 16:
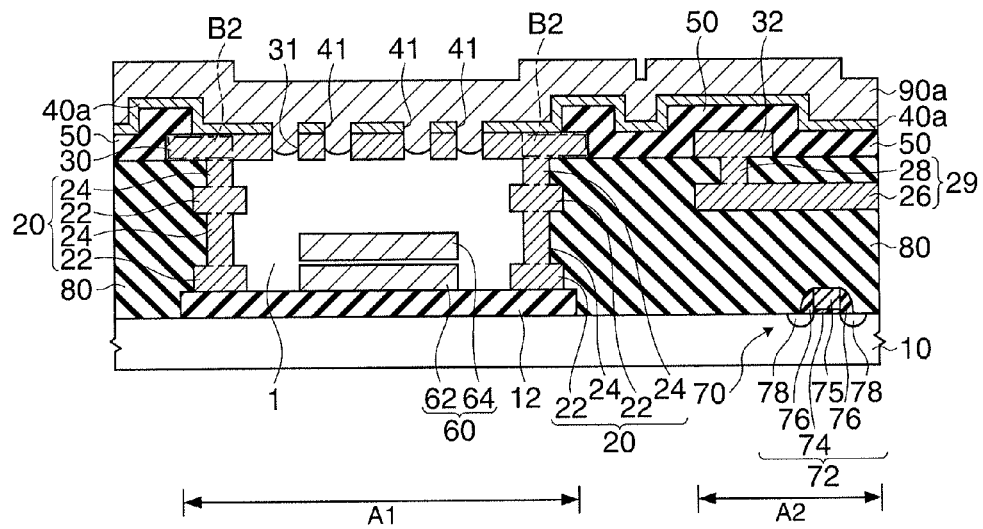
FIG. 16 schematically shows a cross section of the electronic device in a step of the manufacturing method in accordance with the embodiment.

Then, as shown in FIG. 16, a third layer 90a is formed on the second layer 40a. The third layer 90a is formed on the second layer 40a by, for example, a sputter method, a vapor phase deposition method such as a CVD method, or the like. The third layer 90a can seal the through holes 31 and 41 as it is formed by a vapor phase deposition method. Moreover, it is possible to seal the cavity 1 while it is in a reduced pressure state, if the third layer 90a is formed by a vapor phase deposition method.

Figure 17:
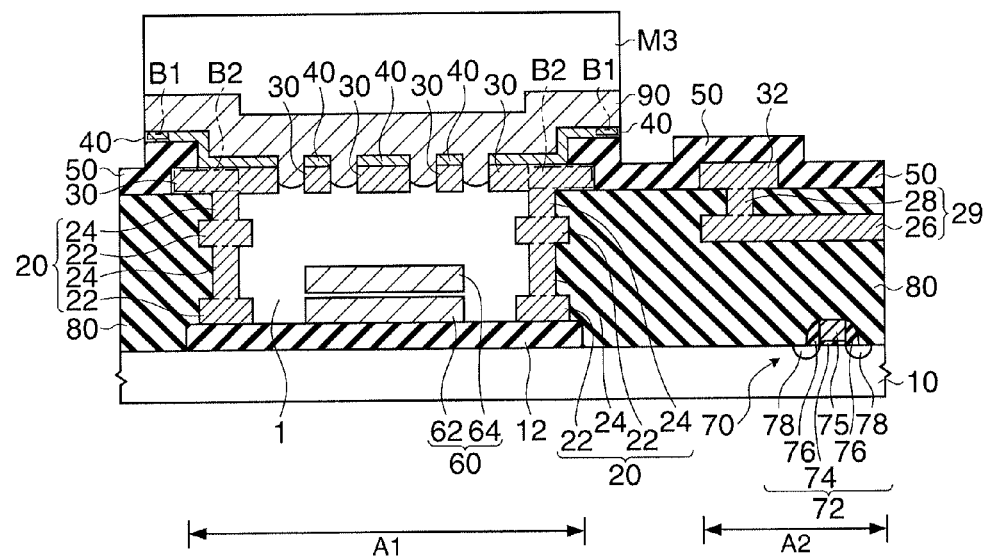
FIG. 17 schematically shows a cross section of the electronic device in a step of the manufacturing method in accordance with the embodiment.

Then, as shown in FIG. 17, patterning is conducted using a mask M3 by photolithograph technique and etching technique, thereby removing the second layer 40a and the third layer 90a in the second region A2, whereby the second layer 40 and the third layer 90 in the shape shown in FIG. 1 can be formed.

Figure 18:
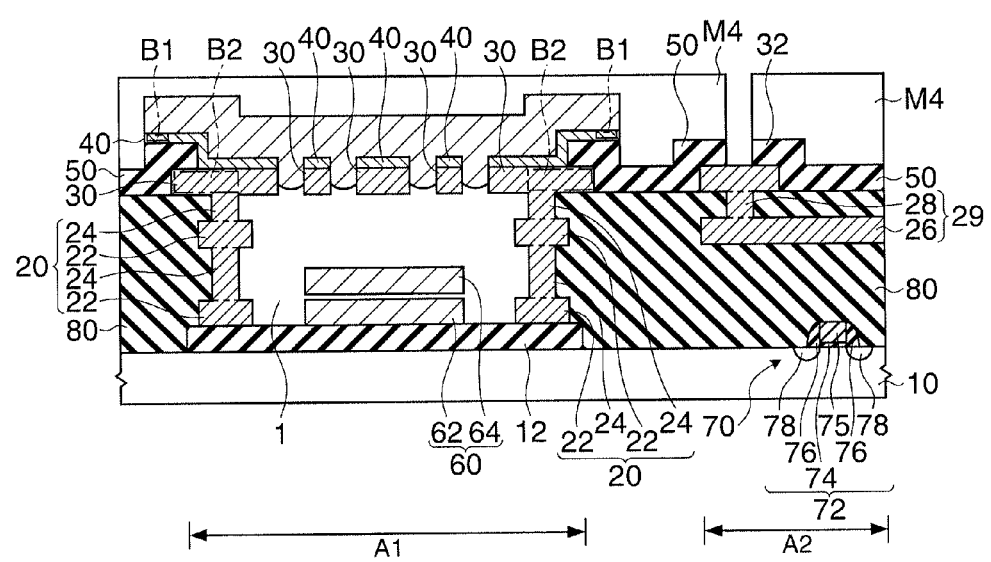
FIG. 18 schematically shows a cross section of the electronic device in a step of the manufacturing method in accordance with the embodiment.

Thereafter, a process of etching the dielectric layer 50 may be conducted, using a mask M4, as shown in FIG. 18, for electrical connection of the pad 32 in the second region A2, if necessary.

By the process described above, the electronic device 100 can be manufactured.

According to the method for manufacturing an electronic device in accordance with the present embodiment, the second layer 40 has the region B1 disposed outside the outline of the first layer 30, and the dielectric layer 50 is disposed below the region B1 disposed outside the outline of the first layer 30 as viewed in a plan view of the second layer 40, such that the electronic device 100 can be manufactured with members that have high mechanical strength for forming the cavity 1. Also, according to the method for manufacturing an electronic device of the present embodiment, in the step of forming the cavity 1 that contains the functional element 60 by etching and removing the interlayer dielectric layer 80 surrounded by the sidewall 20 (i.e., release etching step), the second region A2 is protected by the second layer 40, such that the etching process can be performed for an extended period of time. Furthermore, the release etching step can be performed without using a resist mask, such that organic solution can be used in the cleaning step, and therefore, for example, sticking can be controlled. Moreover, as a resist mask is not used, the step of removing a resist mask is not necessary, and problems such as contamination and the like can be reduced.

In this invention, the statement "a specific member B is disposed (or formed) on (or below) another specific member A" is not limited to the case where the member B is disposed (or formed) directly on (or below) the member A, but includes the case where the member B is disposed (or formed) above (or below) the member A through another member, within the range that does not obstruct the action and effect of the invention.

The invention is not limited to the embodiments described above, and many modifications can be made. For example, the invention may include compositions that are substantially the same as the compositions described in the embodiments (for example, a composition with the same function, method and result, or a composition with the same object and effect). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. An electronic device comprising:
   a substrate;
   a sidewall that is disposed on the substrate and forms a cavity;
   a first layer that is disposed on the sidewall and covers the cavity;
   a second layer that is formed on the first layer and has a region disposed outside an outline of the first layer in a plan view, the first layer and the second layer having common through holes penetrating to the cavity;
   a dielectric layer disposed below the region of the second layer disposed outside the outline of the first layer in a plan view;
   a functional element disposed inside the cavity; and
   a third layer formed on the second layer, the third layer sealing the through holes.

2. The electronic device according to claim 1, wherein the region disposed outside the outline of the first layer in a plan view of the second layer encircles the cavity.

3. The electronic device according to claim 1, wherein the dielectric layer is present between a region disposed outside an outline of the cavity in a plan view of the first layer and the second layer.

4. The electronic device according to claim 1, wherein the third layer includes a layer formed from one kind or an alloy of two or more kinds selected from the group consisting of Al, W and Cu.

5. The electronic device according to claim 1, wherein the second layer includes a layer formed from one kind or an alloy or a composite nitride of two or more kinds selected from the group consisting of TiN, TaN, Ti, Ta, W, Au, Pt, Co and Ni.

6. The electronic device according to claim 1, wherein the first layer includes a laminated structure having three layers or more,
   an uppermost layer of the laminated structure being a layer formed from one kind or an alloy of two or more kinds selected from the group consisting of TiN, Ti, W, Au and Pt, a lowermost layer of the laminated structure being a layer formed from one kind or an alloy of two or more kinds selected from the group consisting of TiN, Ti, W, Au and Pt, and at least one of the layers in the laminated structure being composed of Al—Cu alloy.

* * * * *